United States Patent
Langford, II

(10) Patent No.: US 6,671,860 B2
(45) Date of Patent: Dec. 30, 2003

(54) METHOD AND APPARATUS FOR FAULT INJECTION USING BOUNDARY SCAN FOR PINS ENABLED AS OUTPUTS

(75) Inventor: Thomas L. Langford, II, Wichita, KS (US)

(73) Assignee: LSI Logic Corporation, Milpitas, CA (US)

( * ) Notice: Subject to any disclaimer, the term of this patent is extended or adjusted under 35 U.S.C. 154(b) by 3 days.

(21) Appl. No.: 10/123,615

(22) Filed: Apr. 16, 2002

(65) Prior Publication Data

US 2003/0196179 A1 Oct. 16, 2003

(51) Int. Cl.[7] .............................................. G06F 17/50
(52) U.S. Cl. .................. 716/2; 716/4; 716/5; 716/6
(58) Field of Search ............. 716/2, 4–6; 714/724–727, 714/718

(56) References Cited

U.S. PATENT DOCUMENTS

| | | | | |
|---|---|---|---|---|
| 5,084,874 A | * | 1/1992 | Whetsel, Jr. ................. 714/727 |
| 5,621,740 A | * | 4/1997 | Kamada ..................... 714/727 |
| 5,719,876 A | * | 2/1998 | Warren ....................... 714/718 |
| 6,539,511 B1 | * | 3/2003 | Hashizume ................. 714/727 |
| 6,560,739 B1 | * | 5/2003 | Chung ........................ 714/726 |

OTHER PUBLICATIONS

Bulent I. Dervisoglu; "Towards a standard approach for controlling board–level test functions", International Test Cojnference, pp. 582–590, 1990.*

Melvin A. Breuer and Jujng–Cheun Lien, "A test maintenance controller for a module containing testable chips", International Test Conference, 1998, pp. 502–513.*

Hyun. Jin Kim, Jongchul Shin and Sungho Kang, "An efficeint interconnect test using BIST module in a boundary–scan environment", Computer Design, 1999. (ICCD '99) International Conference, Oct. 10–13, 1999, pp. 328–329.*

* cited by examiner

Primary Examiner—Vuthe Siek
Assistant Examiner—Naum Levin
(74) Attorney, Agent, or Firm—Lathrop & Gage, L.C.

(57) ABSTRACT

Structure and associated methods of operation for an enhanced boundary scan register structure in an integrated circuit that permits flexible application of stuck-at faults or normal operation on each I/O pad of the IC. Each pad may be individually controlled to force a desired stuck-at fault or may be permitted to operate normally. The additional structure integrates with existing boundary scan register structures to minimize the need for additional logic and latches as compared to prior techniques and to minimize additional globally routed signals. Additional commands decoded by TAP command processing provides desired specialized control for the enhanced boundary scan register.

11 Claims, 4 Drawing Sheets

METHOD AND APPARATUS FOR FAULT INJECTION USING BOUNDARY SCAN FOR PINS ENABLED AS OUTPUTS

BACKGROUND OF THE INVENTION

1. Field of the Invention

The invention relates generally to fault injection as applied to hardware and software system testing and more specifically relates to an enhanced boundary scan cell architecture and method for use thereof to provide controllable fault injection in a system board under test.

2. Discussion of Related Art

In the design of electronic systems, it is generally known in the art that a system should be tested by simulating fault conditions to verify proper operation of the system in response to such simulated fault conditions. In general, a system includes discrete electronic components mounted on a printed circuit board (PCB) and interconnected by conductive signal paths (traces) etched onto and into the printed circuit board. Such signal paths are conductive material affixed to the surface of the printed circuit board or embedded within layers of the printed circuit board.

Interconnecting such signal paths between multiple layers requires conductive material extending between two such conductive signal paths on different layers of the printed circuit board. Such multiplayer interconnecting signal pads are typically referred to as "vias."

As the electronics industry has evolved, the density of pins or pads on integrated circuits (ICs) used to connect circuitry components to conductive paths on the PCB has risen dramatically. Further, the density of the interconnecting signal paths and vias on the PCB has similarly increased. Such increases in density have required corresponding decreases in the physical dimensions of pins or pads of ICs mounted on a PCB as well as corresponding decreases in the physical dimensions of signal paths and vias on the various layers of the printed circuit board.

The goal of being able to verify the system in an operational mode requires some ability to emulate a system fault condition. Using simulation techniques requires that accurate models be developed for each of the complex devices often present in present day printed circuit boards. The ability and cost to develop the required models is often beyond the capabilities of many companies. In addition, running a simulation of a complete system for testing of such fault conditions can require an enormous amount of computational time and resources.

In view of the problems with simulation of such fault conditions, it is common practice to run the actual system and physically inject fault conditions so as to observe the result in operation of the system. The fault is injected by physical contact between a test probe and a conductive point on the system board (i.e., a signal trace or via or a connector pad on a particular circuit component). However, the interconnect densities of systems boards has increased and the physical dimensions of signal traces, vias and connector pads on integrated circuit components have correspondingly decreased. The ability to make accurate physical contact with signals on a printed circuit board for purposes of injecting a fault signal has become more difficult if not impossible in view of these factors. Further, there is a concern that the system board and/or components on the board may be damaged due to the length of time that a signal may be forced or overdriven to inject a desired fault condition. Lastly, there is a desire to automate the test process as much as possible to improve the quality and accuracy of the test as well as reduce the costs to perform the test.

Another approach entails the use of boundary scan register features within most present-day integrated circuit designs to inject faults on global signals distributed throughout the PCB system under test. In general, boundary scan features within present-day integrated circuits allow for application of signals to the input and output signal pads of an integrated circuit package by shifting control and data information into individual devices of the system and controlling or observing output and input of the components independent of normal system operation.

Various problems arise in attempting to use boundary scan features that support fault injection as presently embodied within most integrated circuits. First, all pins must be faulted in the same state. In other words, if a desired fault is a "stuck at 1" fault condition, all signal paths will be forced to simulate the stuck at 1 fault conditions. Similarly, to simulate a "stuck at 0" fault condition, all signals will simulate the stuck at 0 fault condition due to the use of present boundary scan features. It is not possible with present boundary scan register designs to test some pins for stuck at 1 injected faults while testing other pins for stuck at 0 faults. Further, it is riot possible with present boundary scan features to test some pins for injected faults without necessarily affecting all pins of ICs with boundary scan features on the PCB. Further, present techniques for using boundary scan features of ICs on a PCB to perform fault injection require a minimum of one additional signal to be routed to all boundary scan elements within ICs of the PCB. As many as three additional signals may be required in many common scenarios.

In at least one known variation to the approach of using present boundary scan features to perform fault injection testing, individual pins/pads of an IC may be individually controlled. However, this known approach adds several combinatorial gates and a latch to each boundary scan register structure and at least one additional signal path globally routed to all boundary scan registers of ICs in the PCB system. This added complexity can dramatically increase cost and complexity of the system. Another approach adds several logic gates and a latch to the complement of circuits in a standard boundary scan register structure. As above, this added structure is unduly complex.

It is evident from the above discussion that a need exists for improved architecture for use of boundary scan features to aid in fault injection testing of a PCB system design.

SUMMARY OF THE INVENTION

The present invention solves the above and other problems, thereby advancing the state of the useful arts, by providing structures and methods for using an enhanced boundary scan circuit design to provide flexible fault injection testing capability. More specifically, the structure of the present invention adds two 2-input logic gates (an OR gate and an AND gate) to each boundary scan register structure of each pin of each IC on the PCB plus one globally routed signal. Additional special instructions issued to the test access port (TAP) portion of the IC modify control of the existing boundary scan register structure to enhance its operation in conjunction with the added gates and global signal of the present invention. The structure of the present invention adds minimal complexity to the boundary scan structure of the ICs of the PCB as compared to prior techniques. A second exemplary preferred embodiment further provides that an additional XOR logic gate may be added to permit selective complementing of an inbound system signal to serve as the injected fault.

Associated methods of use of the structure provide for issuance of newly defined special instructions to allow flexible definition of fault injection test sequences whereby pins of ICs on the PCB may be individual controlled to provide a stuck at 1 condition, a stuck at 0 condition or may operate normally in accordance with the design of the IC. The additional special instructions operate the enhanced boundary scan register structure to enable use of the capture flip-flop (CAP_FF) as a signal to enable selective application of the pre-loaded stuck-at fault to the output pad or to enable normal operation (i.e., application of the standard system output signal to the output pad. The structures and methods of the present invention add minimal complexity to the standard boundary scan registers of the IC while permitting enhanced flexibility in individually selecting controlled application of a stuck-at fault on each output pad of an IC.

A first feature of the invention therefore provides for an improved boundary scan cell, the improvement comprising: an enhanced boundary scan enable signal to controllably enable enhanced operation of the boundary scan cell; an AND gate having an output and having a first input coupled to the output of a capture flip-flop of the boundary scan cell and having a second input coupled to the enhanced boundary scan enable signal; and an OR gate having a first input coupled to a boundary scan mode signal of the boundary scan cell and having a second input coupled to the output of the AND gate and having an output coupled to the selection input of a multiplexer of the boundary scan cell for selectively applying the output of a hold latch of the boundary scan cell to an outbound operational signal of the boundary scan cell.

Another aspect of the invention further provides a second AND gate having an output and having a first input coupled to the enhanced boundary scan enable signal and having a second input coupled to an inbound operational signal of the boundary scan cell; and an XOR gate having its output selectively coupled through the multiplexer to the outbound operational signal path and having a first input coupled to the output of the hold latch and having a second input coupled the output of the second AND gate whereby the XOR gate is operable to selectively compliment the inbound operational signal for application to the multiplexer based on the signal in the hold latch.

Another feature of the invention provides for a boundary scan cell comprising: a first signal pathway selectively configured to apply an inbound operational signal to an outbound operational signal path; and a second signal path for selectively applying a predetermined fault signal to the outbound operational signal path.

Another aspect of the invention further provides an enhanced boundary scan enable signal for selectively enabling operation of the second signal pathway and disabling operation of the first signal pathway.

Another aspect of the invention further provides a third signal pathway selectively configured to apply an inbound scan signal to an outbound scan signal path.

Another aspect of the invention further provides a first enable signal for selectively enabling operation of the second signal pathway and disabling operation of the first signal pathway; and a second enable signal for selectively enabling operation of the third signal pathway and for disabling operation of the first signal pathway and for disabling operation of the second signal pathway.

Another feature of the invention provides a method for injecting a fault condition on an I/O signal pad of the integrated circuit comprising the steps of: loading a fault signal representing the fault condition into the hold latch of the boundary scan register associated with the I/O signal pad; loading the capture flip-flop of the boundary scan register with a cell enable signal value; applying a global enable signal to an enhanced operation enable input of the boundary scan register; and applying the fault signal to the I/O signal pad in response to the combination of the application of the global enable signal to the enhanced operation enable input and the loading of the cell enable signal in the capture flip-flop.

Another aspect of the invention further provides for complimenting the fault signal prior to applying the fault signal to the I/O pad.

Another aspect of the invention further provides that the step of loading a fault signal comprises the step of: applying a preload instruction to the TAP controller of the integrated circuit.

Another aspect of the invention further provides that the step of applying a global enable signal comprises the step of applying a first instruction to the TAP controller, and that the step of loading the capture flip-flop comprises the step of applying a second instruction to the TAP controller.

DETAILED DESCRIPTION OF THE PREFERRED EMBODIMENTS

Figure 1:
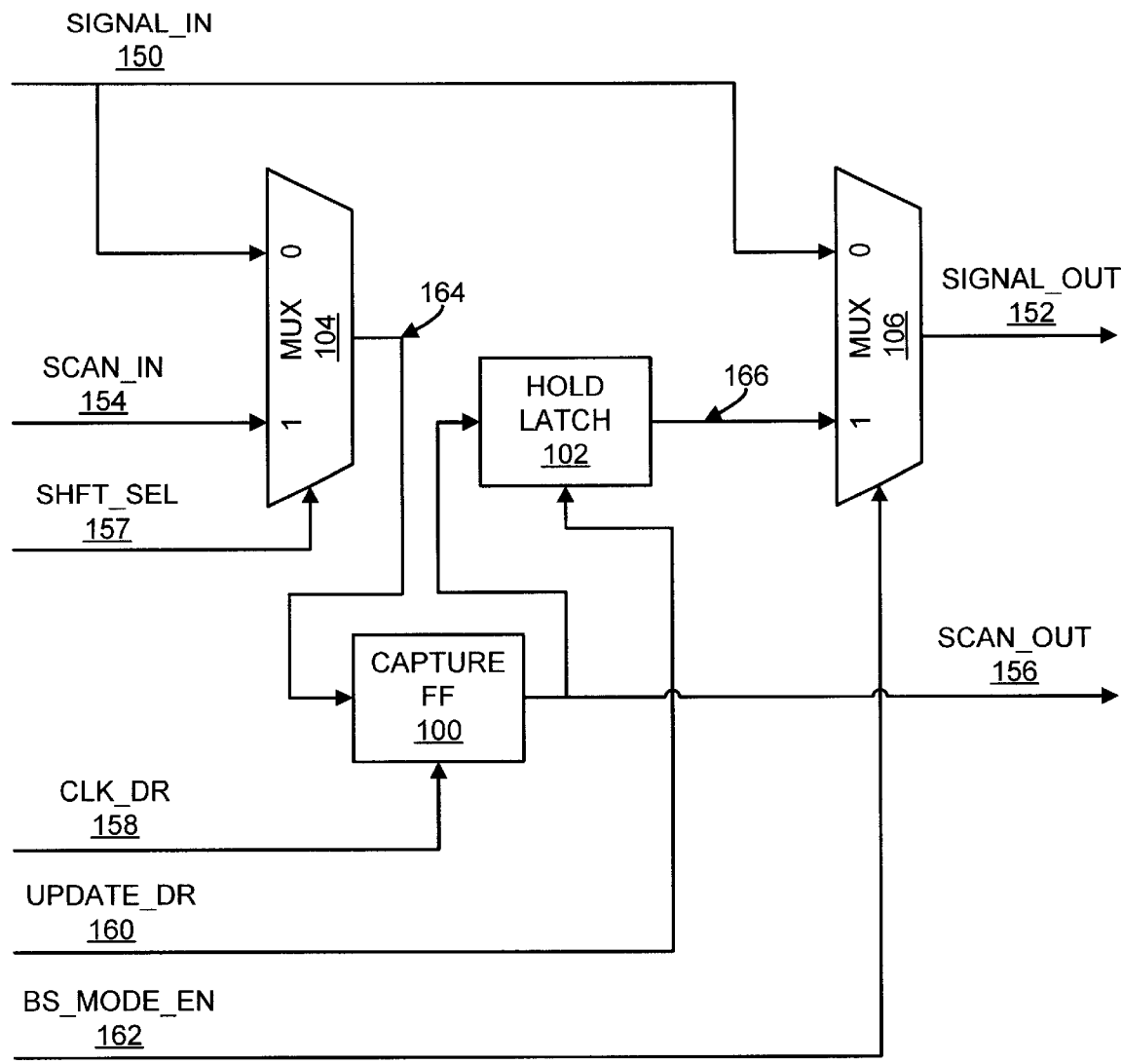
FIG. 1 is a block diagram of a typical boundary scan cell as presently practiced in the art.

While the invention is susceptible to various modifications and alternative forms, a specific embodiment thereof has been shown by way of example in the drawings and will herein be described in detail. It should be understood, however, that it is not intended to limit the invention to the particular form disclosed, but on the contrary, the invention is to cover all modifications, equivalents, and alternatives falling within the spirit and scope of the invention as defined by the appended claims.

FIG. 1 is a block diagram of a boundary scan cell as presently known in the art fore use in association with an I/O signal path within an integrated circuit component. As is well-known in the electronic arts, a boundary scan cell (often referred to as a boundary scan register) provides a signal path whereby an inbound signal 150 (SIGNAL_IN also referred to herein as an inbound operational signal) is applied through multiplexer 106 to an outbound signal path 152 (SIGNAL_OUT also referred to herein as an outbound operational signal). This default signal path provides the operational signaling for the particular input or output signal path with which a boundary scan cell is associated. During normal operation, inbound signals on path 150 are applied via multiplexer 106 to outbound signal path 152 in accordance with the standard processing requirements of the integrated circuit signal path. Those of ordinary skill in the art will recognize that the boundary scan cell function (described further herein below) may be similarly applied to an inbound signal path providing an external signal applied to an input signal pad of the integrated circuit as well as to and outbound signal path wherein a signal generated within the integrated circuit is applied to an external signal path further processing. Further, boundary scan cell logic (described further herein below) may be applied to an input/output (bidirectional) signal path. Such application of boundary scan technology to input signals, output signals, and bidirectional input/output signals is well-known in the electronic arts.

A standard feature of boundary scan cell technology as presently practiced in the art provides another signal path whereby a scan input signal on path 154 (SCAN_IN) is applied through multiplexer 104 to capture flip-flop 100. The output of capture flip-flop 100 is then applied both to scan output signal path 156 (SCAN_OUT) and as an input to hold latch 102. The output of old latch 102 is applied as a second input to multiplexer 106 for selective application to output signal path 152. A first clock signal on path 158 (CLK_DR) enables loading of capture flip-flop 100 with the present selected output signal from multiplexer 104 applied via path 164 as in input to capture flip-flop 100. An update enable signal on path 160 (UPDATE_DR) similarly clocks the loading of hold latch 102 with the present stored value in capture flip-flop 100 applied via path 156 to and input of hold latch 102.

As presently practiced in the art, a boundary scan mode enable signal on path 162 (BS_MODE_EN) selectively applies the present value stored in hold latch 102 via path 166 to a second input of multiplexer 106 for application to output signal path 152. When so enabled, multiplexer 106 applied the present value stored in hold latch 102 to the output signal path 152.

Those of ordinary skill in the art will readily understand that such boundary scan cell logic associated with each I/O signal path of an integrated circuit may preferably be linked together in a serial fashion such that the scan out signal (path 156) of a first boundary scan cell is coupled to the scan input signal (path 154) of a next boundary scan cell associated with another I/O signal path of the integrated circuit. Standard features of such boundary scan logic allow shifting of information through all boundary scan registers in a serial fashion by appropriate clocking of shift select signal path 157 (SHFT_SEL), clock signal path 158, and optionally, update clocking signal path 160.

Operation of such a serial chain of boundary scan cells associated with I/O signals of an integrated circuit is generally controlled by issuing encoded instructions to a test access port (TAP) of the integrated circuit. Standard commands include a "preload" command that shifts a stream of serial data bits through a chain of boundary scan registers connected one to another within the integrated circuit. Use of such boundary scan registers in sequential chains is well-known to those of ordinary skill in the art for purposes of testing various features within an integrated circuit.

It is also generally known in the art that boundary scan features associated with I/O signal pads of an integrated circuit may be used to verify aspects of a printed circuit board external to the particular integrated circuit. For example, boundary scan register features within one integrated circuit may be chained to boundary scan features of other, distinct integrated circuits for purposes of testing continuity of signal traces on the printed circuit board coupling the two (or more) integrated circuits.

Those of ordinary skill in the art will recognize that FIG. 1 is intended merely as exemplary of a typical boundary scan cell design associated with an I/O pad of a typical integrated circuit. This well-known exemplary design is suggested within the "IEEE Standard Test Access Port and Boundary Scan Architecture" standard specification (IEEE standard 1149.1 published originally in 1990 and readily available to the public from the IEEE organization). Further, use of such a standard boundary scan register design to effectuate boundary scan chain test techniques within an integrated circuit and between integrated circuits is also well-known and documented in the IEEE specifications.

Figure 2:
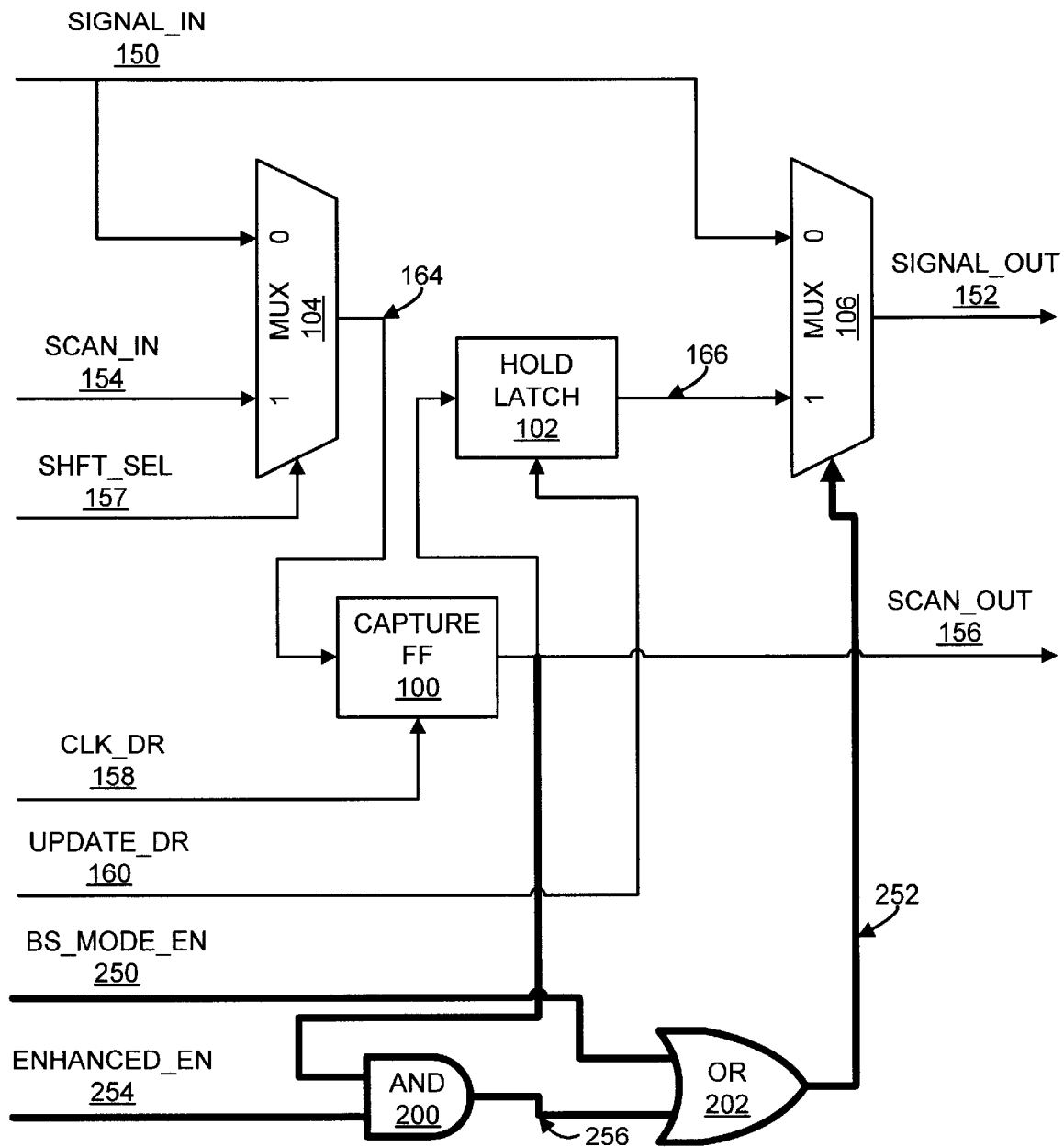
FIG. 2 is a block diagram of an exemplary preferred embodiment of an enhanced boundary scan cell in accordance with the present invention to provide fault injection test features with minimal complexity added to the cell.

Still further, as discussed above, use of such boundary scan register features of integrated circuits for purposes of fault injection is generally known however past techniques and structures added significant cost and complexity to the boundary scan cell design. By contrast, FIG. 2 depicts an exemplary preferred embodiment of an enhanced boundary scan cell design in accordance with the present convention to provide fault injection features coupled with boundary scan features with minimal increased complexity in the boundary scan cell structure. In particular, fault injection test capabilities are added to the boundary scan cell architecture shown in FIG. 2 with the addition of two logic gates (AND gate 200 and OR gate 202) and a single globally routed fault injection enable signal (ENHANCED_EN on signal path 254). By contrast to prior fault injection test features integrated with prior boundary scan cell designs, the present invention provides a simple enhancement with minimal added complexity and global signal routing within the integrated circuit.

The boundary scan cell architecture depicted in FIG. 2 is operable as a standard boundary scan register similar to that of FIG. 1 except that the boundary scan mode enable signal path 250 is routed through OR gate 202 as a first input rather than directly routed to the selection input of multiplexer 106 (as shown in FIG. 1). The output of OR gate 202 is applied via path 252 to the selection input of multiplexer 106 and provides the desired controlled selection of signals to be applied to output signal path 152. By asserting boundary scan mode enable signal path 250 as presently known in the art, the boundary scan cell design of FIG. 2 operates essentially identically to that of FIG. 1. When boundary scan mode enable signal 250 remains de-asserted, the output of AND gate 200 applied via path 256 as a second input to OR gate 202 provides an alternate signal path for enabling controlled selection of signals applied via multiplexer 106 to output signal path 152. AND gate 200 receives the present value stored in capture flip-flop 100 as a first input signal and receives a globally routed fault injection enable signal on path 254 as a second input. When the present value stored in capture flip-flop 100 is a logic one value and the globally routed enhanced enable signal 254 is asserted, AND gate 200 asserts a logic one signal on its output path 256 thereby enabling selection of an alternate signal to be applied via multiplexer 106 to output signal path 152.

When used for purposes of fault injection testing, hold latch 102 is preferably preloaded with a desired fault signal value (i.e., a stuck at zero or stuck at one fault value). For each boundary scan cell to be faulted in the fault injection testing, the capture flip-flop 100 of that boundary scan cell will be loaded with a logical one value. The globally routed enhanced enable signal 254 is then asserted to enable application of the fault signal stored in hold latch 102 to signal output path 152 via path 166 and multiplexer 106. In this manner, the enhanced boundary scan cell depicted in FIG. 2 permits individual I/O signal pads of an integrated circuit to be controllably forced to a desired fault value. Other well-known testing techniques may then monitor the processing of the integrated circuit and the associated system to verify proper operation of the circuit and system in response to the injected fault signal.

The enhanced boundary scan cell design of FIG. 2 permits fault injection testing using boundary scan cells within an integrated circuit enhanced so as to permit individual I/O signal pads associated with the integrated circuit to be faulted while other I/O signals may operate normally. This enhanced flexibility for fault injection testing using boundary scan cell features is provided with minimal added complexity in the boundary scan cell design (i.e., two logic gates and one globally routed signal).

Figure 4:
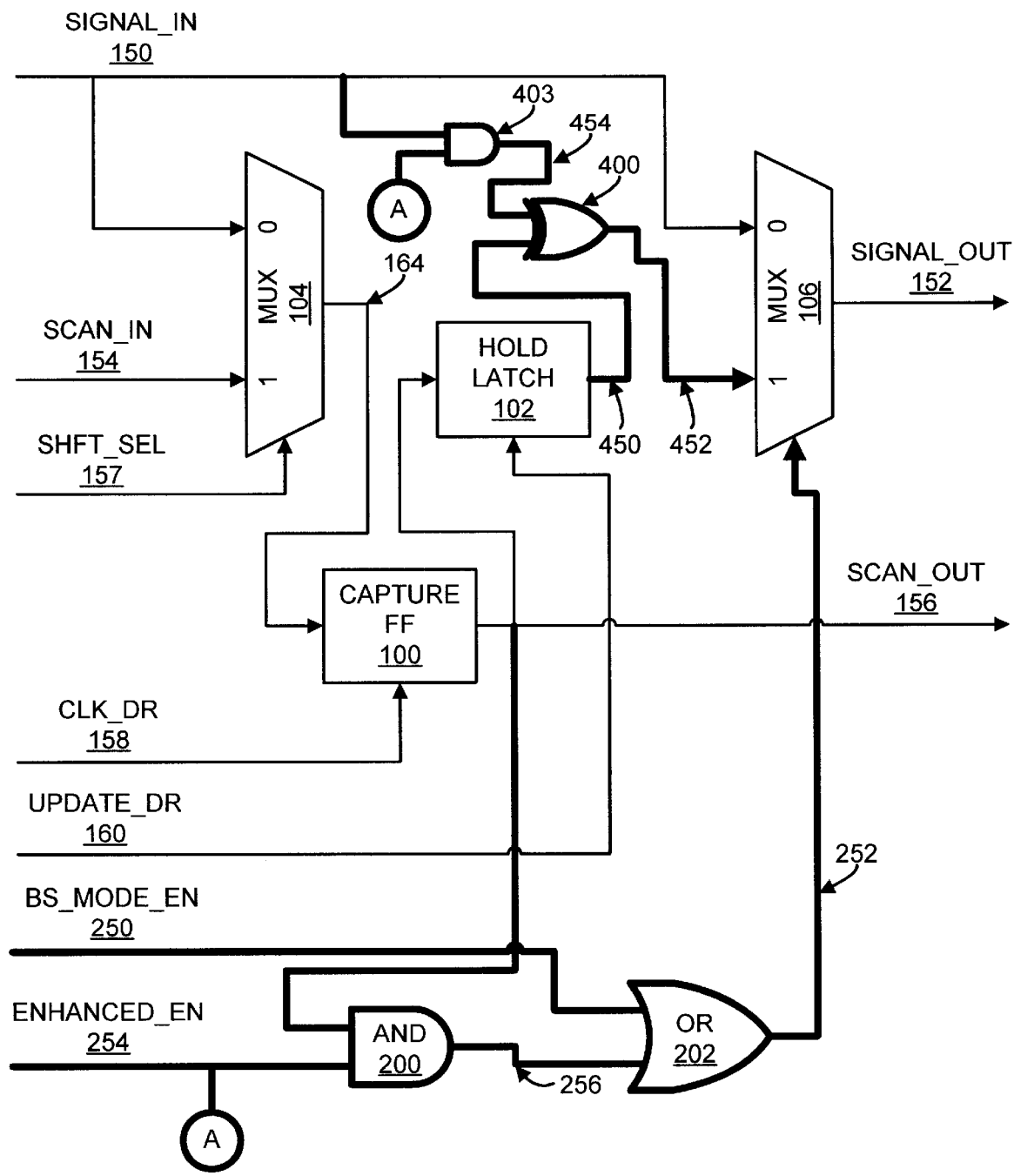
FIG. 4 is a block diagram of an alternate exemplary embodiment of the enhanced boundary scan cell structure of FIG. 2 providing a simple structure for complimenting the injected fault signal value.

As compared to the known boundary scan cell architecture of FIG. 1, enhanced features of the exemplary enhanced boundary scan cell of FIG. 2 are enhanced with darkened lines. Those of ordinary skill in the art will recognize a variety of equivalent embodiments to achieve this flexible test feature with minimal added complexity to the boundary scan cell design. FIG. 4 provides a block diagram of an alternate exemplary embodiment of an enhanced boundary scan cell in accordance with the present invention that adds an additional feature with the addition of two logic gates. FIG. 4 is essentially identical to FIG. 2 with the addition of XOR gate 400 and AND gate 403. XOR gate 400 is positioned between the output of hold latch 102 and multiplexer 106. AND gate 403 is positioned between signal 150 and an input of XOR gate 400. XOR gate 400 has one input coupled to the output of AND gate 403 and its other input coupled to the output of hold latch 102 via path 450. The output of XOR gate 400 is coupled via path 452 to the second input of multiplexer 106.

The output of AND gate 403 is the inbound operational signal from path 150 gated by the enhanced boundary scan enable signal on path 254. During fault injection operation of the boundary scan register enabled by signal path 254, the signal value in hold latch 102 is exclusive ORd (XORd) with the gated inbound signal applied to the output of AND gate 403 on path 454. This XORd value is then applied via path 452 to the second input of multiplexer 106. By preloading the signal value in hold latch 102 (as discussed above), a user may selectively compliment the gated inbound signal for application to the outbound signal path 152. This allows simple definition of an injected fault whereby the outbound signal (on path 152) is the compliment of the intended inbound signal (on path 150). In particular, preloading the hold latch 102 with a logic 1 signal value enables the enhanced boundary-scan fault injection to compliment the inbound operational signal on path 150 and apply it to outbound operational signal path 152 as the desired "fault." by contrast, preloading the hold latch 102 with a logic 0 signal will cause the inbound operation signal on path 150 to be applied unchanged to the outbound operational signal path 152.

The enhanced boundary scan cell of FIGS. 2 and 4 may also be understood as providing a number of signal pathways. One signal pathway is provided when neither boundary scan mode enable (250) nor enhanced boundary scan enable (254) is asserted. In this case the boundary scan features of the cell are disabled and the cell operates in the normal functional manner of the circuit. The defined signal pathway essentially connects the inbound signal path (150) to the outbound signal path (152) for normal operation of the cell.

Another signal pathway is provided when, as in FIG. 2, boundary scan mode enable (250) is asserted. In this mode, a signal pathway is defined that couples the output of hold latch 102 on path 166 to the outbound signal path 152. This mode allows for standard boundary scan features to be used as well-known in the art.

Yet another signal pathway is provided when, as in FIG. 2, the enhanced boundary scan enable signal (254) is asserted. In this mode, the output of the hold latch 102 is selectively applied to the outbound signal path 152 under control of the output of the capture flip-flop 100. This enhanced mode of operation enables operation of the fault injection features of the present invention through the boundary scan cell.

Still another signal pathway is defined when, as in FIG. 4, the enhanced boundary scan enable signal (254) is asserted and the hold latch is preloaded with a fault injection control signal value. As noted above, this signal pathway applies the inbound signal on path 150 to an input of an XOR gate 400 such that it may be selectively complimented by a signal preloaded into hold latch 102. This particular fault injection selectively compliments the inbound signal (150) for application to the outbound signal (152).

Figure 3:
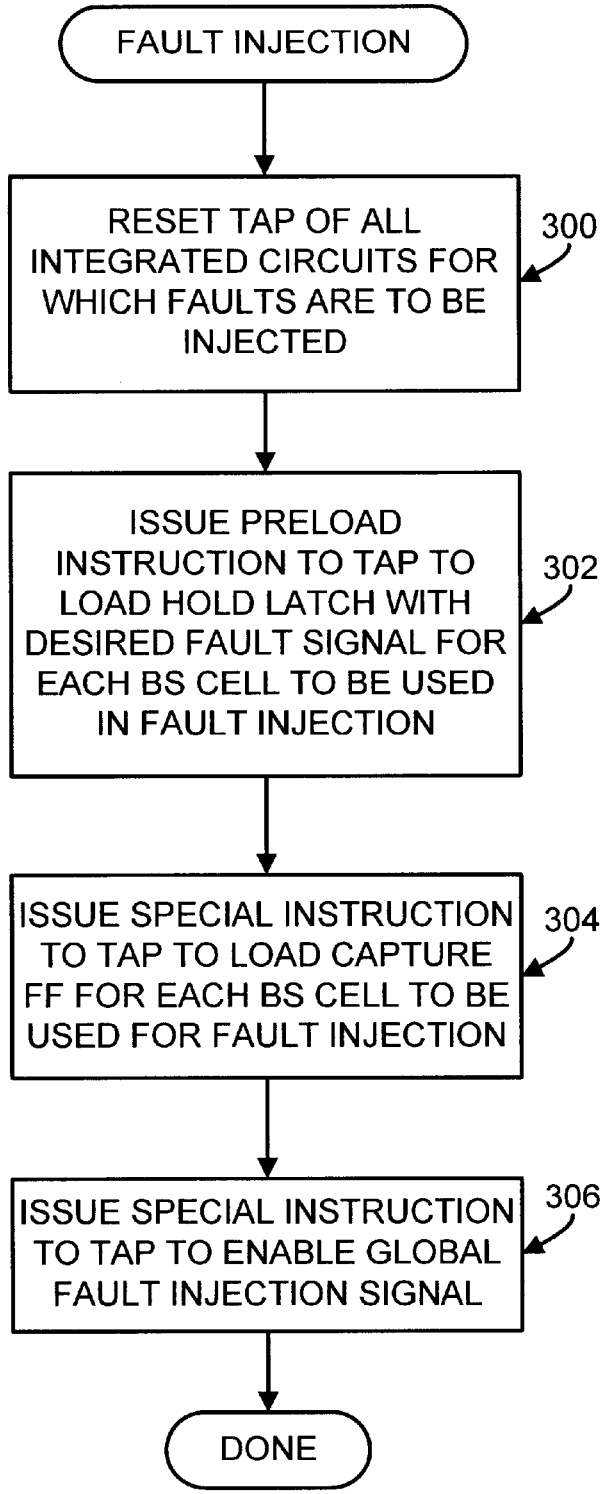
FIG. 3 is a flowchart describing a fault injection test process of the present invention applying an enhanced boundary cell structure such as depicted in FIG. 2.

FIG. 3 is a flowchart describing a method of the present invention utilizing an enhanced boundary scan cell design as exemplified in FIG. 2 for purposes of fault injection testing. Element 300 is first operable to reset the test access port (TAP) of all integrated circuits involved in the desired fault injection test sequence. Those of ordinary skill in the art will recognize that numerous global and localized reset signals may be used for this purpose. Element 302 then issues a standard "preload" instruction to the TAP for each integrated circuit involved in the fault injection test sequence. The "preload" instruction as used in this method serves to allow loading the boundary scan register cells with the desired fault signal value into the hold latch for each boundary scan register involved in the fault injection test. As is known in the art, the preload instruction issued to the TAP connects the boundary scan register between TDI and TDO and allows data to be shifted through all boundary scan register cells configured in a sequential chain in the SHIFT_DR state of the TAP controller until all boundary scan register cells have desired values loaded in their respective hold latches. Element 304 then issues a new special instruction to the TAP for each integrated circuit involved in the fault injection test. The new special instruction is decoded by the TAP instruction decode logic (not shown) and loads a logic one value into the capture flip-flop for each boundary scan cell involved in the desired fault injection test. As noted above, the capture flip-flop of each boundary scan cell involved in a fault injection test is loaded with a logical one value to permit enabling and disabling of each individual boundary scan cell for interaction with the intended fault injection test. This instruction also inhibits the UPDATE_DR signal 160. Thus, hold latch 102 contains the fault signal to be injected and the capture flip-flop 100 contains the enable value for the register cell. Lastly, element 306 issues another special instruction to the TAP of each integrated circuit associated with the intended fault injection test. The second special instruction causes the global fault injection enable signal (ENHANCED_EN) to be asserted. As noted above with respect to FIG. 2 the globally asserted fault injection enable signal is AND'd with the capture flip-flop value stored in each individual boundary scan cell of the integrated circuit to generate the selection signal. The selection signal so generated is applied to the multiplexer to select either the inbound signal or the fault value stored in the hold latch for application to the output signal path of the I/O component of the IC. In addition, while this instruction is active, the TAP BYPASS register is connected between TDI and TDO and the CLK_DR signal applied to the boundary scan register is inhibited.

Those of ordinary skill in the art will recognize a variety of equivalent methods for using the enhanced boundary scan cell design of FIGS. 2 and 4, as well as other equivalent structures, for performing fault injection tests of an IC or a system incorporating the IC.

While the invention has been illustrated and described in the drawings and foregoing description, such illustration and description is to be considered as exemplary and not restrictive in character, it being understood that only the preferred embodiment and minor variants thereof have been shown and described and that all changes and modifications that come within the spirit of the invention are desired to be protected.

What is claimed is:

1. In an integrated circuit design, an improved boundary scan cell, the improvement comprising:
   an enhanced boundary scan enable signal to controllably enable enhanced operation of said boundary scan cell;
   an AND gate having an output and having a first input coupled to the output of a capture flip-flop of said boundary scan cell and having a second input coupled to the enhanced boundary scan enable signal; and
   an OR gate having a first input coupled to a boundary scan mode signal of said boundary scan cell and having a second input coupled to the output of said AND gate and having an output coupled to the selection input of a multiplexer of said boundary scan cell for selectively applying the output of a hold latch of said boundary scan cell to an outbound operational signal of said boundary scan cell.

2. The improved boundary scan cell of claim 1 wherein the improvement further comprises:
   a second AND gate having an output and having a first input coupled to said enhanced boundary scan enable signal and having a second input coupled to an inbound operational signal of said boundary scan cell; and
   an XOR gate having its output selectively coupled through said multiplexer to said outbound operational signal path and having a first input coupled to the output of the hold latch and having a second input coupled said output of said second AND gate whereby said XOR gate is operable to selectively compliment said inbound operational signal for application to said multiplexer based on the signal in said hold latch.

3. A boundary scan cell comprising:
   a first signal pathway selectively configured to apply an inbound operational signal to an outbound operational signal path;
   a second signal path for selectively applying a predetermined fault signal to said outbound operational signal path; and
   a third signal pathway selectively configured to apply an inbound scan signal to an outbound scan signal path.

4. The boundary scan cell of claim 3 further comprising:
   an enhanced boundary scan enable signal for selectively enabling operation of said second signal pathway and disabling operation of said first signal pathway.

5. The boundary scan cell of claim 3 further comprising:
   a first enable signal for selectively enabling operation of said second signal pathway and disabling operation of said first signal pathway; and
   a second enable signal for selectively enabling operation of said third signal pathway and for disabling operation of said first signal pathway and for disabling operation of said second signal pathway.

6. In an integrated circuit configured for boundary scan capability, a method for injecting a fault condition on an I/O signal pad of said integrated circuit comprising the steps of:
   loading a fault signal representing said fault condition into the hold latch of the boundary scan register associated with said I/O signal pad;
   loading the capture flip-flop of said boundary scan register with a cell enable signal value;
   applying a global enable signal to an enhanced operation enable input of said boundary scan register; and
   applying said fault signal to said I/O signal pad in response to the combination of the application of said global enable signal to said enhanced operation enable input and the loading of said cell enable signal in said capture flip-flop.

7. The method of claim 6 further comprising the step of:
   complimenting said fault signal prior to applying said fault signal to said I/O pad.

8. The method of claim 6 wherein the step of loading a fault signal comprises the step of:
   applying a preload instruction to the test access port ("TAP") controller of said integrated circuit.

9. The method of claim 8
   wherein the step of applying a global enable signal comprises the step of applying a first instruction to said TAP controller, and
   wherein the step of loading said capture flip-flop comprises the step of applying a second instruction to said TAP controller.

10. In an integrated circuit design, an improved boundary scan cell having an inbound operational signal and having an outbound operational signal and having a scan input signal and having a capture flip-flop with an input selectively coupled either to said inbound operational signal or to said scan input signal and having a hold latch with an input coupled to the output of said capture flip-flop and with an output selectively applied through a multiplexer to said outbound operational signal wherein said multiplexer has a selection input coupled to a boundary scan mode signal, the improvement comprising:
   an enhanced boundary scan enable signal to enable enhanced operation of the improved boundary scan register;
   an AND gate having an output and having a first input coupled to the output of the capture flip-flop and having a second input coupled to the enhanced boundary scan enable signal; and
   an OR gate having a first input coupled to the boundary scan mode signal and having a second input coupled to the output of said AND gate and having an output coupled to the selection input of said multiplexer.

11. The improved boundary scan cell of claim 10 wherein the improvement further comprises:
    a second AND gate having an output and having a first input coupled to said enhanced boundary scan enable signal and having a second input coupled to said inbound operational signal of said boundary scan cell; and
    an XOR gate having its output selectively coupled through said multiplexer to said outbound operational signal path and having a first input coupled to the output of the hold latch and having a second input coupled said output of said second AND gate whereby said XOR gate is operable to selectively compliment said inbound operational signal for application to said multiplexer based on the signal in said hold latch.

* * * * *